US008569092B2

(12) United States Patent
Mantravadi et al.

(10) Patent No.: US 8,569,092 B2
(45) Date of Patent: Oct. 29, 2013

(54) METHOD FOR FABRICATING A MICROELECTROMECHANICAL SENSOR WITH A PIEZORESISTIVE TYPE READOUT

(75) Inventors: Naresh Venkata Mantravadi, San Jose, CA (US); Sisira Kankanam Gamage, Fremont, CA (US)

(73) Assignee: General Electric Company, Schenectady, NY (US)

( * ) Notice: Subject to any disclaimer, the term of this patent is extended or adjusted under 35 U.S.C. 154(b) by 317 days.

(21) Appl. No.: 12/647,660

(22) Filed: Dec. 28, 2009

(65) Prior Publication Data

US 2011/0159627 A1 Jun. 30, 2011

(51) Int. Cl.
*H01L 21/00* (2006.01)
(52) U.S. Cl.
USPC ........... 438/52; 438/48; 438/53; 257/E21.214
(58) Field of Classification Search
USPC .................. 438/48, 52, 53; 257/E21.214
See application file for complete search history.

(56) References Cited

U.S. PATENT DOCUMENTS

| | | | |
|---|---|---|---|
| 3,819,431 A * | 6/1974 | Kurtz et al. ..................... | 438/53 |
| 5,395,802 A | 3/1995 | Kiyota et al. | |
| 5,576,250 A | 11/1996 | Diem et al. | |
| 5,747,353 A | 5/1998 | Bashir et al. | |
| 5,889,211 A * | 3/1999 | Maudie et al. .................. | 73/720 |
| 5,996,411 A | 12/1999 | Leonardson et al. | |
| 6,104,073 A | 8/2000 | Ferrari et al. | |
| 6,619,133 B1 * | 9/2003 | Goshoo et al. .................. | 73/754 |
| 7,223,624 B2 | 5/2007 | Wu et al. | |
| 2003/0057513 A1 * | 3/2003 | Leedy ............................ | 257/506 |
| 2004/0065638 A1 | 4/2004 | Gogoi | |
| 2005/0172717 A1 * | 8/2005 | Wu et al. ..................... | 73/514.34 |
| 2006/0272414 A1 | 12/2006 | Ayazi | |

FOREIGN PATENT DOCUMENTS

EP 1561724 A1 8/2005

OTHER PUBLICATIONS

Search Report from corresponding EP Application No. 10195522.7-1236 dated May 9, 2011.

* cited by examiner

*Primary Examiner* — Kimberly Rizkallah
*Assistant Examiner* — Duy T Nguyen
(74) *Attorney, Agent, or Firm* — Global Patent Operation; Mark A. Conklin

(57) ABSTRACT

A method for fabricating a sensor is disclosed that in one embodiment bonds an etched semiconductor substrate wafer to an etched device wafer comprising a double silicon on insulator wafer to create a suspended structure, the flexure of which is sensed by an embedded piezoresistive sensor element. In one embodiment the sensor measures acceleration. In other embodiments the sensor measures pressure.

19 Claims, 8 Drawing Sheets

METHOD FOR FABRICATING A MICROELECTROMECHANICAL SENSOR WITH A PIEZORESISTIVE TYPE READOUT

BACKGROUND OF THE INVENTION

The subject matter herein relates generally to semiconductor microelectromechanical (MEMS) based sensor configurations that can be used to detect small forces or flexures generated from mechanical stress, chemo-mechanical stress, thermal stress, electromagnetic fields, and the like. More particularly, the subject matter disclosed herein relates to a method for fabricating a MEMS based sensor, in particular acceleration and pressure sensors with piezoresistive type readout.

Advances in semiconductor microelectronic and MEMS based sensors have served greatly to reduce the size and cost of such sensors. The electrical and mechanical properties of silicon microsensors have been well chronicled. Silicon micromachining and semiconductor microelectronic technologies have blossomed into a vital sensor industry with numerous practical applications. For instance, micromachined silicon pressure sensors, acceleration sensors, flow sensors, humidity sensors, microphones, mechanical oscillators, optical and RF switches an attenuators, microvalves, ink jet print heads, atomic force microscopy tips and the like are widely known to have found their way into various applications in high volume medical, aerospace, industrial and automotive markets. The high strength, elasticity, and resilience of silicon makes it an ideal base material for resonant structures that may, for example, be useful for electronic frequency control or sensor structures. Even consumer items such as watches, scuba diving equipment and hand-held tire pressure gauges may incorporate silicon micromachined sensors.

The demand for silicon sensors in ever expanding fields of use continues to fuel a need for new and different silicon microsensor geometries and configurations optimized for particular environments and applications. Unfortunately, a drawback of traditional bulk silicon micromachining techniques has been that the contours and geometries of the resulting silicon microstructures have been significantly limited by the fabrication methods. For instance, etching silicon structures with conventional etching techniques is constrained, in part, by the crystal orientations of silicon substrates, which limits the geometry and miniaturization efforts of many desired structures.

The increasing use of microsensors to measure pressure or acceleration has spurred the development of small silicon plate structures used, for example, as capacitors and to produce electrostatic forces. For instance, there exist microsensors that measure capacitance using an array of interdigitated polysilicon plates. Similarly, there exist microsensors that produce electrostatic forces using an array of layered plates. Further, there exist microsensors that measure the flexure, or bending, of silicon structures in response to forces such as weight or acceleration.

In applications where it is desired to obtain both pressure and acceleration measurements. In such applications, fabricating both pressure and acceleration sensors on a single chip would be advantageous. As pressure and acceleration sensors are fabricated to smaller dimensions, it is desired to integrate both types of sensors on a single chip and at the same time optimize the material and structural characteristics as well as the methods of manufacturing. It is further desired to manufacture smaller acceleration sensors with high sensitivity and high reliability.

The expanding fields of use of microelectromechanical devices in general, and of accelerometers and pressure sensors in particular, has created a demand for ever smaller devices. Unfortunately, there has been difficulty producing smaller devices that are also highly sensitive to small changes in acceleration or pressure. For example, there has been a need for a smaller accelerometer that combines sufficiently thin flexure structures with a sufficiently large proof mass (or seismic mass) to be responsive to small changes in acceleration. Additionally, because of the small size of the devices and the thin nature of the geometries used, conventional techniques for producing such micromechanical devices risk both breakage during the manufacturing process and potentially diminished reliability in the field.

It would be advantageous to provide one or more sensors fabricated on a single chip that provide the needed performance characteristics with improved manufacturing and operational reliability.

BRIEF DESCRIPTION OF THE INVENTION

A method for fabricating a sensor is disclosed, in one embodiment comprising the steps of forming a substrate recess in a semiconductor substrate wafer, forming a device recess in a semiconductor device wafer, wherein the device wafer comprises a first device layer, a second device layer, a first oxide layer, and a second oxide layer, wherein the first oxide layer is located under the first device layer, the second device layer is located under the first oxide layer, and the second oxide layer is located under the second device layer, and wherein the device recess extends through the first device layer to expose the first oxide layer, securing the first device layer to the substrate wafer, wherein the device recess is aligned over the substrate recess, and implanting at least one piezoresistive sensor element in the second device layer to sense flexure in the second device layer.

In another embodiment, the method further comprises forming a suspended structure in the device wafer disposed over the substrate recess, wherein the suspended structure includes a boundary region that is released from other portions of the device wafer except in a flexure region of the boundary region, wherein the suspended structure includes a proof mass comprised of a portion of the first device layer, the first oxide layer and the second device layer, wherein the flexure region of the boundary region and released portion of the boundary region are disposed to permit movement of the proof mass in response to a force, wherein the movement of the proof mass causes flexure in the flexure region, and wherein the piezoresistive sensor element senses the flexure in the flexure region.

In another embodiment, the second device layer forms a diaphragm over the device recess and the substrate recess that allows flexure in the second device layer, and wherein the piezoresistive sensor element senses the flexure in the diaphragm.

In some embodiments, the sensor can measure acceleration. In other embodiments, the sensor can measure pressure.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of invention. Thus, for further understanding of the invention, reference can be made to the following detailed description, read in connection with the drawings in which.

DETAILED DESCRIPTION OF THE INVENTION

Figure 1:
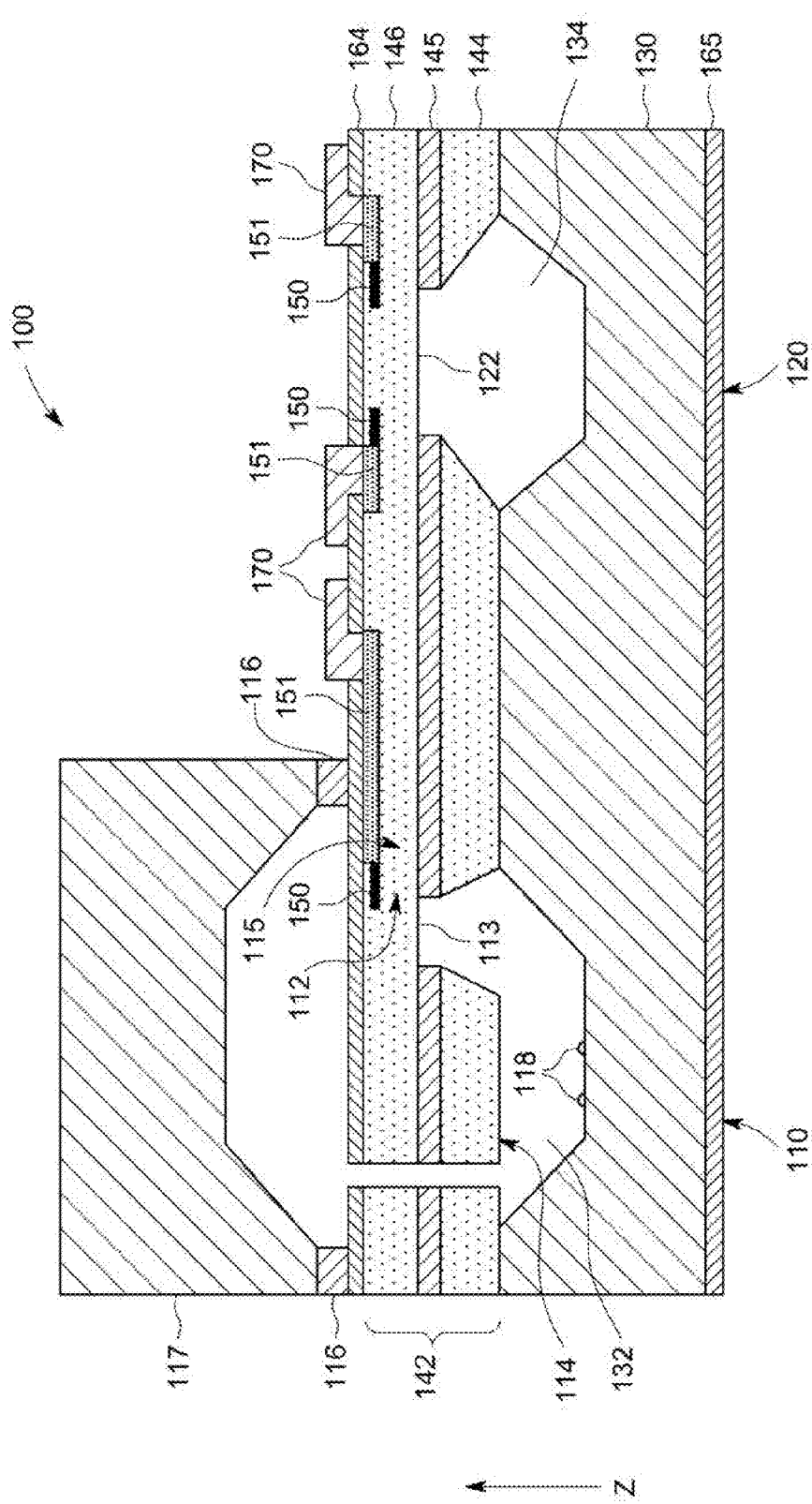
FIG. 1 is a cross sectional view of an exemplary silicon chip having integrated acceleration and pressure sensors in one embodiment of the invention.

One exemplary device and manufacturing process in accordance with an embodiment of the invention provides an integrated piezoresistor accelerometer and pressure sensor using silicon fusion bonding with silicon and oxide etch techniques on a double silicon on insulator (DSOI) wafer. The exemplary device and process can integrate piezoresistor accelerometers with a proof mass (sometimes referred to as a seismic mass) and absolute pressure sensors on a single chip.

Another exemplary device and manufacturing process in accordance with another embodiment of the invention provides an accelerometer manufactured with a thinned cantilever beam including a flexure region and relatively large proof mass. The exemplary accelerometer with a thinned beam offers improved sensitivity and enhanced reliability through use of a flexure with smaller structural dimensions.

Various advantages may be realized in the practice of some embodiments of the described exemplary devices and manufacturing processes. For instance, the overall chip size may be made smaller than conventional chips because the process does not require a potassium hydroxide (KOH) etch from the backside of the substrate wafer, i.e., "backside etching." Further, the planar manufacturing processes are ideal for manufacturing purposes. Thinning the flexure beam in relation to the proof mass allows for increased sensitivity with small structure dimensions. Further, in an integrated accelerometer and pressure sensor chip process the acceleration sensor beam flexure thickness can be sized independent of the pressure sensor diaphragm thickness while maintaining a planar top surface and efficient manufacturing processes.

The devices and manufacturing processes also allow for over-range protection and anti-stiction mechanisms to be easily included in the accelerometer portion of the structure. Additionally, only a single cap is needed for the chip, e.g., to cover the proof mass of the accelerometer, as compared to conventional chips that typically require a second cap for the pressure sensor. The exemplary single chip processes therefore allow for greater design flexibility and a smaller chip size with simplified manufacturing processes.

An integrated chip with an accelerometer and pressure sensor may be used in many applications. One exemplary application is remote tire pressure monitoring. A small chip with integrated accelerometers and pressure sensors is ideal for remotely indicating tire pressure in relation to a vehicle's speed or acceleration (linear speed and acceleration can be derived from the rotational acceleration experienced by the accelerometer). The single integrated chip can be packaged or coupled with an ASIC chip or the like to remotely retrieve and manipulate the piezoresistive sensor readings related to pressure and acceleration.

It should be recognized, however, that the integrated chip and associated methods of manufacture are useful in a wide variety of other applications not explicitly described herein.

An exemplary micromachined acceleration sensor can be made by forming a proof mass that extends away from a larger body of a silicon wafer through the attachment of a cantilever beam. In this embodiment, the beam acts as a flexure structure. Acceleration sensors measure acceleration by sensing the movement of the proof mass relative to the wafer or substrate. In particular, as the proof mass moves relative to the wafer, properly placed piezoresistive sensor elements near or on the beam sense flexure in the beam caused by the movement of the proof mass indicated by a change in resistance of the piezoresistive sensor element.

Acceleration sensor sensitivity can be selectively determined by the thickness of the various layers of the DSOI wafer, in particular the layer that defines a flexure region of the cantilever beam in relation to the distally located larger proof mass. Acceleration sensors may thus be made to smaller dimensions resulting in increased sensitivity. The different layers of the DSOI wafer can be selectively etched to form recesses therein, with embedded oxide layers forming etch stops that assist and simplify the fabrication process.

An exemplary micromachined absolute-pressure sensor can be made by forming a cavity within a silicon structure and a diaphragm adjacent to the cavity. For an absolute-pressure sensor the cavity can be held in a vacuum. The absolute-pressure sensor measures pressure by sensing the flexure of the diaphragm, e.g., how the pressure acting on the front side of the diaphragm deflects the diaphragm inwards. One or more piezoresistive sensors formed near the edges of the diaphragm typically sense the flexure or deflection of the diaphragm.

Figure 4:
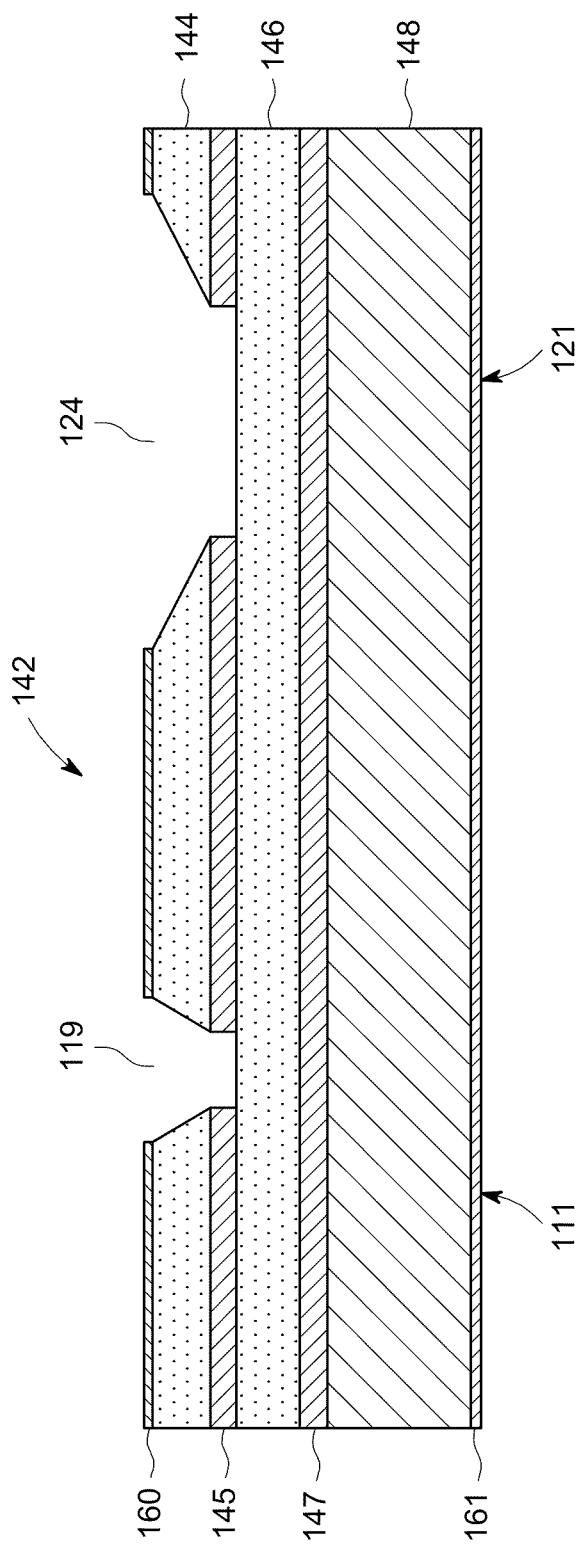
FIG. 4 is a cross sectional view of an exemplary device wafer with etched device recesses in one embodiment of the invention.

FIG. 1 is a cross sectional view of an exemplary silicon chip 100 having integrated acceleration and pressure sensors in one embodiment of the invention. One side of chip 100 can include the acceleration sensor 110 of the integrated chip 100 and the other side of chip 100 can include the pressure sensor 120 of the integrated chip 100. Acceleration sensor 110 and pressure sensor 120 can be formed over substrate recesses 132 and 134 in a silicon wafer 130, either an n-type or p-type silicon wafer that in one embodiment can be between 385 µm and 600 µm. Positioned over silicon wafer 130 can be a device wafer 142. Device wafer 142 may be a conventional double silicon on insulator wafer. As shown in FIG. 4, the double silicon on insulator wafer may consist of alternating device layers, namely first device layer 144 and second device layer 146, and buried oxide layers, namely first oxide layer 145 and second oxide layer 147. Returning to FIG. 1, p-type piezoresistive sensor elements 150 can be strategically implanted within the second device layer 146 to sense flexure in the silicon structures. Chip 100 can also include an upper chip passivation layer 164 and a lower chip passivation layer 165 that can consist of, for example, a silicon dioxide layer or silicon nitride layers. Upper and lower chip passivation layers 164 and 165 provide insulation for proper operation of chip 100. Metal interconnects 170 formed on device wafer 142 can electrically couple the piezoresistive sensor elements 150 to the exterior of the chip 100.

Figure 2:
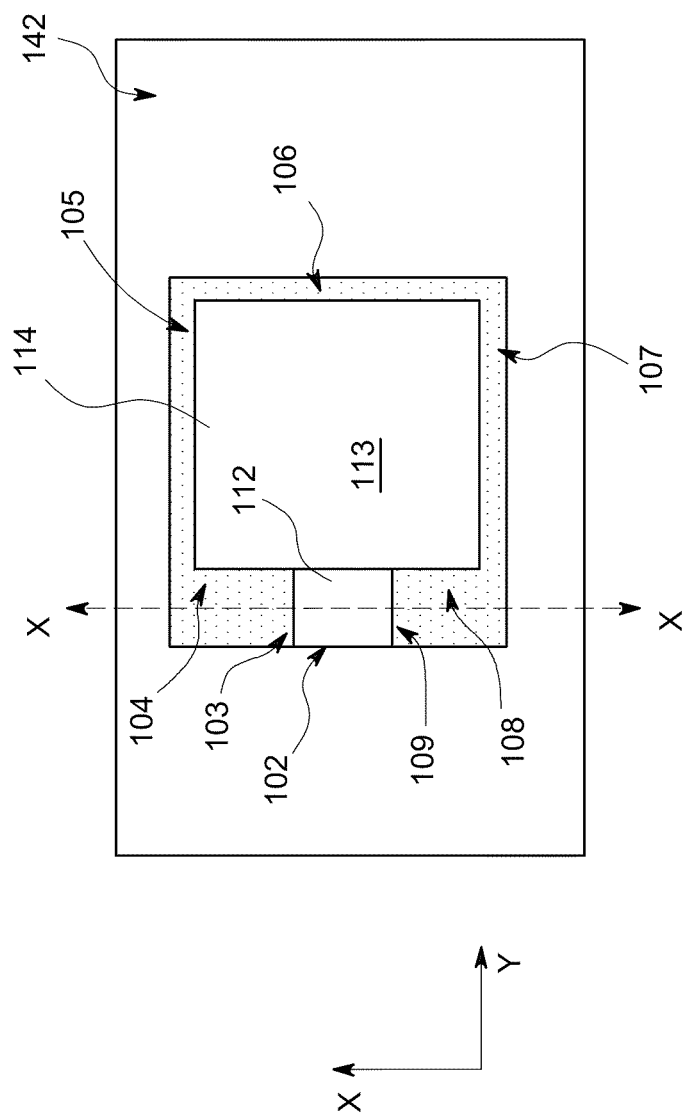
FIG. 2 is a top view of an exemplary acceleration sensor in one embodiment of the invention.

With reference to FIGS. 1 and 2, an exemplary acceleration sensor 110 and operation thereof is described in one embodiment of the invention. FIG. 2 illustrates an exemplary top view of the suspended structure of the acceleration sensor 110 of FIG. 1 that can be disposed above substrate recess 132. However, for illustrative purposes, metal interconnections 170, upper chip passivation layer 164, and piezoresistive elements 150 of FIG. 1 are not shown. A beam 113 can be suspended over substrate recess 132. The beam 113 can include a flexure region 112 and a proof mass region 114. The beam 113 can also include generally horizontal boundary regions 102 to 109 which can surround the flexure region 112 and the proof mass region 114. A thinned flexure region 112 of the beam 113 can be constructed to thicker portions of the device wafer 142 along one boundary region 102 of the beam 113. The other boundary regions 102 to 109 of the beam 113 can be released from the device wafer 142 so that the beam 113 can be suspended over the substrate recess 132, and so that the beam 113 can flex most freely in a direction generally perpendicular to horizontal dimensions of device wafer 142.

Slots can be etched vertically completely through the device wafer 142 along boundary regions 103 to 109 to define a cantilever beam 113. Boundary region 102, which is not etched completely through, can be defined by the thickness of the second device layer 146, and can be thinned so as to produce flexure region 112. The flexure region 112 can comprise a proximal end of the beam 113 that can be secured to an anchor region 115 of the device wafer 142. The flexure region 112 can be thin relative to an adjacent anchor region 115 of the device wafer 142 to which the flexure region 112 can be secured. In the embodiment of FIGS. 1 and 2, the anchor region 115 is not suspended over substrate recess 132. However, it will be appreciated that the anchor region 115 can be suspended over substrate recess 132. The flexure region 112 also can be thin relative to the proof mass region 114, which can comprise a distal portion of the beam 113. The thinness of the flexure region 112 relative to the anchor region 115 to which it can be secured, can promote movement of the cantilever beam 113 in a direction generally parallel to a vertical dimension of the device wafer 142. The vertical dimension of the device wafer 142 is indicated by an arrow labeled z in FIG. 1. The vertical dimension is generally perpendicular to a horizontal plane of device wafer 142.

In particular, the thinness of the flexure 112 relative to the anchor region 115 to which it can be secured facilitates flexure of the flexure region 112 resulting in generally rotational movement of the proof mass region 114 out of the plane of the device wafer 142 about a horizontal axis x-x that runs through the flexure region 112, as shown in FIG. 2. For example, as the flexure region 112 flexes in response to an acceleration force, the proof mass 114 may move, at least temporarily, to a position that can be slightly above or slightly below a horizontal surface of the device wafer 142. The horizontal dimensions of device wafer 142 are indicated by axes labeled x and y in FIG. 2. The horizontal dimensions are parallel to the horizontal plane of device wafer 142. The relative thickness of the proof mass region 114 can further promote such movement when, for example, an acceleration force is applied in a direction generally perpendicular to the horizontal dimension of device wafer 142.

Acceleration sensor 110 thus operates by measuring the flexure in the beam 113 caused by motion of the proof mass 114 that can be positioned over substrate recess 132 by beam 113 extending from device wafer 142. The flex or bend of beam 113 can be sensed by one or more piezoresistive sensor elements 150 that can be located near the anchor region 115, or base of beam 113, i.e., near the point where beam 113 extends from device wafer 142. The change in resistance of piezoresistive sensor elements 150 can be determined via metallization elements 170 to determine the amount of flexure and thus the acceleration experienced by the sensor Further, a cap 117 may be formed over the acceleration sensor 110 portion of the chip 100 to protect the structures from environmental effects. Cap 117 can contain a dampening fluid or gas that surrounds the proof mass 114. Additionally, dimples 118 may be included on the bottom of substrate recess 132 or the underside of cap 117 as over-range protection and anti-stiction structures, i.e., to prevent damage to the structure from large accelerations. For example, the cap 117 and dimples 118 may protect the silicon structure for shock forces up to 10,000 G (1 G=9.81 m/s$^2$).

Pressure sensor 120 operates by measuring flexure in the thinned structure or diaphragm 122 formed in device wafer 142 over the cavity between substrate wafer 130 and device wafer 142. The diaphragm serves as a flexure structure in pressure sensor 120. As the pressure outside of the cavity changes, the diaphragm 122 will flex towards or away from substrate recess 134. In one example, pressure sensor 120 can be formed with a vacuum within the cavity thereby forming an absolute-pressure sensor. Diaphragm 122 will flex inwards towards the cavity in a predictable way from pressure exerted on the diaphragm. The flexure in diaphragm 122 can be detected by one or more piezoresistive sensor elements 150 formed in the second device layer 146 on or near the edges of diaphragm 122. The resistance of piezoresistive elements 150 can be determined via a circuit, such as a wheatstone bridge circuit and the like, interconnected using metallization elements 170. The resistance of the piezoresistive elements 150 varies with flexure of the diaphragm 122. Thus, measurement of the piezoresistive resistance can be used to determine the amount of flexure and thus determine the pressure exerted on the sensor.

Figure 3:
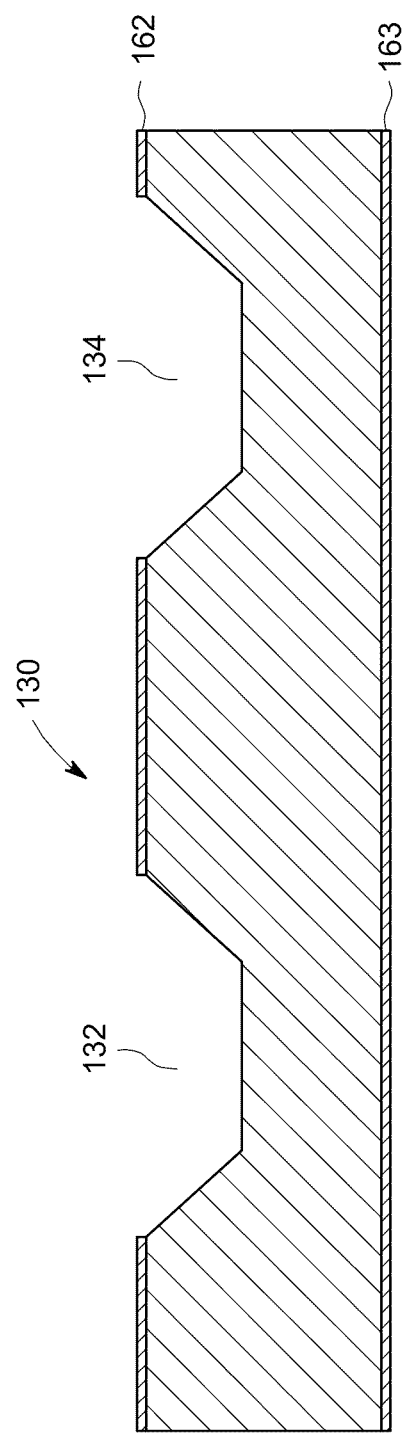
FIG. 3 is a cross sectional view of an exemplary substrate wafer with etched substrate recesses in one embodiment of the invention.

An exemplary process for fabricating a silicon sensor like the one illustrated in FIG. 1 is explained with reference to the illustrations depicted in FIGS. 1 and 3 through 8. FIG. 3 is a cross sectional view of an exemplary substrate wafer 130 with etched substrate recesses 132 and 134 in one embodiment of the invention. Substrate wafer 130 can be a single crystal silicon substrate which, in one embodiment, can be 385 µm to 600 µm thick and have n-type or p-type doping. Additionally, substrate wafer 130 can have upper substrate passivation layer 162 and lower substrate passivation layer 163. Upper and lower substrate passivation layers 162 and 163 can be, for example, silicon dioxide or silicon nitride layers, and can be deposited on the upper and lower surfaces of the substrate wafer 130 using conventional techniques to provide insulation and protection to the substrate wafer 130 during manufacturing.

Figure 8:
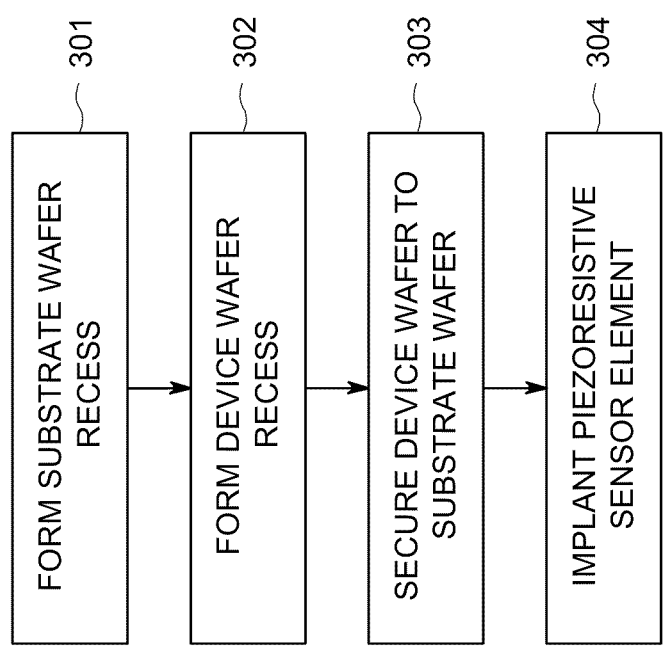
FIG. 8 is a process flow of the steps for fabricating an exemplary sensor in one embodiment of the invention.

FIG. 8 is a process flow showing the steps for fabricating an exemplary sensor in one embodiment of the invention. In step 301, substrate recesses 132 and 134, which can serve as part of the inner cavity of both acceleration sensor 110 and pressure sensor 120, can be formed through the upper substrate passivation layer 162 and into substrate wafer 130 using standard semiconductor etch techniques such as plasma etching, wet etching with potassium hydroxide (KOH), tetramethylammonium hydroxide (TMAH), or other silicon etchants or the like. Additionally, a high anisotropy dry etch can be employed. A high anisotropy etch allows for a higher aspect ratio of substrate recesses 132 and 134.

Substrate recesses 132 and 134 can have any arbitrary geometry and can have any required depth, from less than 0.1 micron to greater than 100 microns, for example, depending on the particular application. Further, one or more dimples 118 (FIG. 1) can be formed in the bottom portion of substrate recess 132 to avoid stiction when the proof mass 114 is displaced beyond its operational range. It should be further noted that substrate recesses 132 and 134 need not have a single, uniform depth. Further, the surfaces of substrate recesses 132 and 134 can be either bare silicon, oxidized silicon, doped silicon, or they can be coated with any other thin film capable of withstanding subsequent wafer bonding and processing temperatures.

FIG. 4 is a cross sectional view of an exemplary device wafer 142 with etched device recesses 119 and 124 in one embodiment of the invention. Device wafer 142 can be a conventional double silicon on insulator (DSOI) wafer. The DSOI wafer may consist of several device layers, namely a first device layer 144 and a second device layer 146, alternating with buried oxide layers, namely a first oxide layer 144 and a second oxide layer 146. In one embodiment, the first device layer 144 can consist of, for example, n-type or p-type silicon having a thickness between 1 μm and 50 μm, while the second device layer 146 can consist of, for example, n-type silicon having a thickness between 1 μm and 50 μm. Additionally, first and second oxide layers 145 and 147 can consist of, for example, silicon dioxide and have a thickness of between 0.25 μm to 1.0 μm. The thickness of the various layers of the DSOI wafer can be precisely set using conventional chip manufacturing techniques, and can be selected such that the thickness of the layers determine the subsequent operating characteristics of both the acceleration sensor 110 and pressure sensor 120, as will be described below.

A handle layer 148 used to grip the device wafer 142 during the manufacturing process can be located at the bottom of the alternating device and buried oxide layers. Handle layer 148 can consist of, for example, n-type or p-type silicon having a thickness between 385 μm to 600 μm. An upper device passivation layer 160 can be deposited on the exterior face of the first device layer 144 and a lower device passivation layer 161 can be deposited on the exterior face of the handle layer 148, both being, for example, conventional silicon dioxide or silicon nitride layers, to insulate and protect the device wafer 142 during the manufacturing process. Device wafer 142 can be divided into acceleration sensor region 111 and pressure sensor region 121.

Next, with reference to step 302 in FIG. 8, device recess 119 and device recess 124, which can be cavities etched into device wafer 142, can be created. The oxide of the upper passivation layer 160 can be etched to reveal the underlying first device layer 144 utilizing conventional wet or dry etching techniques. Etches of upper device passivation layer 160 for both the acceleration sensor region 111 and the pressure sensor region 121 can be performed independently or simultaneously. Once the upper passivation layer 160 is removed and the first device layer 144 is revealed, the silicon of the first device layer 144 can be etched, again using either wet or dry etching techniques conventional in the industry. Etching of the first device layer 144 on the acceleration sensor region 111 can form what will eventually result in beam 113 in the completed acceleration sensor 110, while the same etch on pressure sensor region 121 can form what will eventually result in the diaphragm 122 in the completed pressure sensor 120. First oxide layer 145 provides a convenient etch stop and simplifies the fabrication process.

Each of the etches can have any arbitrary geometry and can have any required depth depending on the particular application. Additionally, the etches need not have a single, uniform depth, and the resulting etches can be isotropic or anisotropic. In one embodiment, partial etches of the first device layer 144 can be made. Likewise, different etch characteristics can be independently developed for both the acceleration sensor region 111 and pressure sensor region 121. The selected depth of each etch can be selected to effect the design characteristics of the resulting acceleration sensor 110 and pressure sensor 120. For example, the depth of the etch made to establish the diaphragm 122 of the pressure sensor 120 can be selected such that the thickness of the diaphragm can be purposefully chosen for a particular pressure range. Further, the thickness of the various device and oxide layers in the DSOI wafer can be selected to control the size of the resulting microdevices and thereby the sensitivity of the resulting sensors. Optionally, depending on design requirements, first oxide layer 145 can also be etched for one or both of the acceleration sensor region 111 or pressure sensor region 121 using either wet or dry etch techniques conventional in the industry, as shown in FIG. 4. If left, first oxide layer 145 can offset stresses from passivation layer 164 in acceleration sensor 110 and pressure sensor 120.

Figure 5:
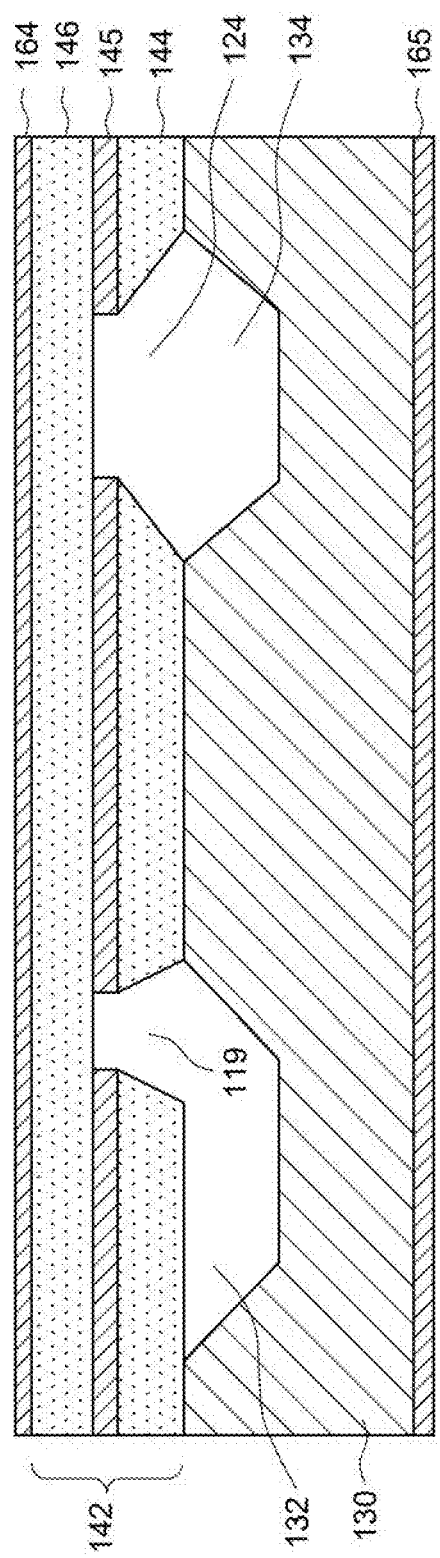
FIG. 5 is a cross sectional view of an exemplary substrate wafer with etched substrate recesses bonded to an exemplary device wafer with etched device recesses in one embodiment of the invention.

Next, with reference to step 303 of FIG. 8, the substrate wafer 130 and device wafer 142 can be aligned and secured together with the first device layer 144 located at the interface between the two wafers. FIG. 5 is a cross sectional view of an exemplary substrate wafer 130 with etched substrate recesses 132 and 134 bonded to an exemplary device wafer 142 with etched device recesses 119 and 124 in one embodiment of the invention. In one embodiment, device recess 119 of device wafer 142 can be aligned near and over one edge of substrate recess 132 formed in the substrate wafer 130 and secured thereto by a silicon fusion bonding (or direct bonding) process. In another embodiment, device recess 124 can be centered over substrate recess 134. In one exemplary fusion bonding technique, the opposing surfaces can be made hydrophilic. That is, they can be treated with a strong oxidizing agent that causes water to adhere to them. The two wafers then can be placed in a high temperature environment for a sufficient period of time demanded by the quality of the bond.

The silicon fusion bonding technique described above bonds the substrate wafer 130 and the device wafer 142 together without the use of an intermediate adhesive material that could have a different coefficient of thermal expansion than the single crystal silicon wafer. Furthermore, fusion bonding can be performed in which oxide or nitride layers have been formed in the bonded surfaces of one or both of the wafers.

After the opposing surfaces of the wafer 130 and device wafer 142 have been bonded, the handle layer 148 of the device wafer 142 can be removed using a wet etchant such as KOH that stops on the second oxide layer 147. Additionally, as shown in FIG. 5, the second oxide layer 147 can be removed using wet or dry etching techniques leaving only the first and second device layers 144 and 146 separated by the first oxide layer 145. Next, upper and lower chip passivation layers 164 and 165 can be deposited on the outer surfaces of the second device layer 146 and substrate wafer 130.

Figure 6:
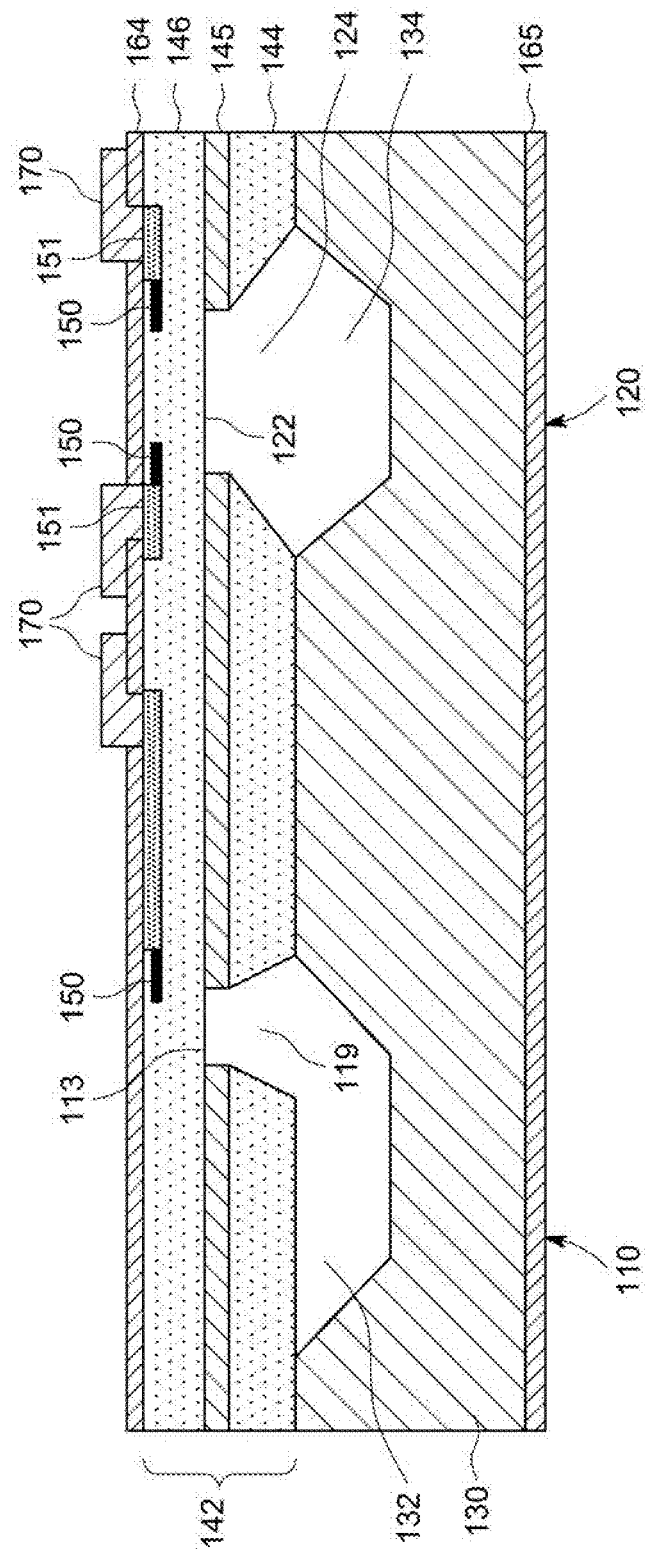
FIG. 6 is a cross sectional view of an exemplary substrate wafer with etched substrate recesses bonded to an exemplary device wafer with etched device recesses, piezoresistive sensor elements and associated interconnects in one embodiment of the invention.

Next with reference to step 304 of FIG. 8, one or more piezoresistive sensor elements 150 can be added by diffusion or ion implanting of, in one embodiment, p-type material into the doped n-type second device layer 146 near the base of beam 113 and near the edges of diaphragm 122. Both beam 113 and diaphragm 122 can be formed as part of the second device layer 146. FIG. 6 is a cross sectional view of an exemplary substrate wafer 130 with etched substrate recesses 132 and 134 bonded to an exemplary device wafer 142 with etched device recesses 119 and 122, piezoresistive sensor elements 150 and associated piezoresistive and metal interconnects, 151 and 170 respectively, in one embodiment of the invention. For example, Boron implantation and diffusion at high temperature may form piezoresistive sensor elements 150. The piezoresistive sensor elements 150 can be positioned to sense flexure in beam 113 and diaphragm 122. It should be noted that any number of piezoresistive sensor elements 150 may be employed and their exact positioning relative to the beam 113 or diaphragm 122 may be different depending on the particular application, expected pressures, accelerations, sensitivity requirements, and the like. Additionally, piezoresistor interconnects 151 that provide electrical conductivity to the piezoresistive sensor elements 150 can be added by diffusion or ion implanting of p-type material into the doped n-type second device layer 146. Next, metal interconnects 170 can be added, providing electrical conductivity from the outer surface of chip 100 to the piezoresistive sensors 150 through piezoresistor interconnects 151. Metal interconnects 170 can be formed of, for example, gold or aluminum, and can be created to a desired thickness to suit chip design needs.

Figure 7:
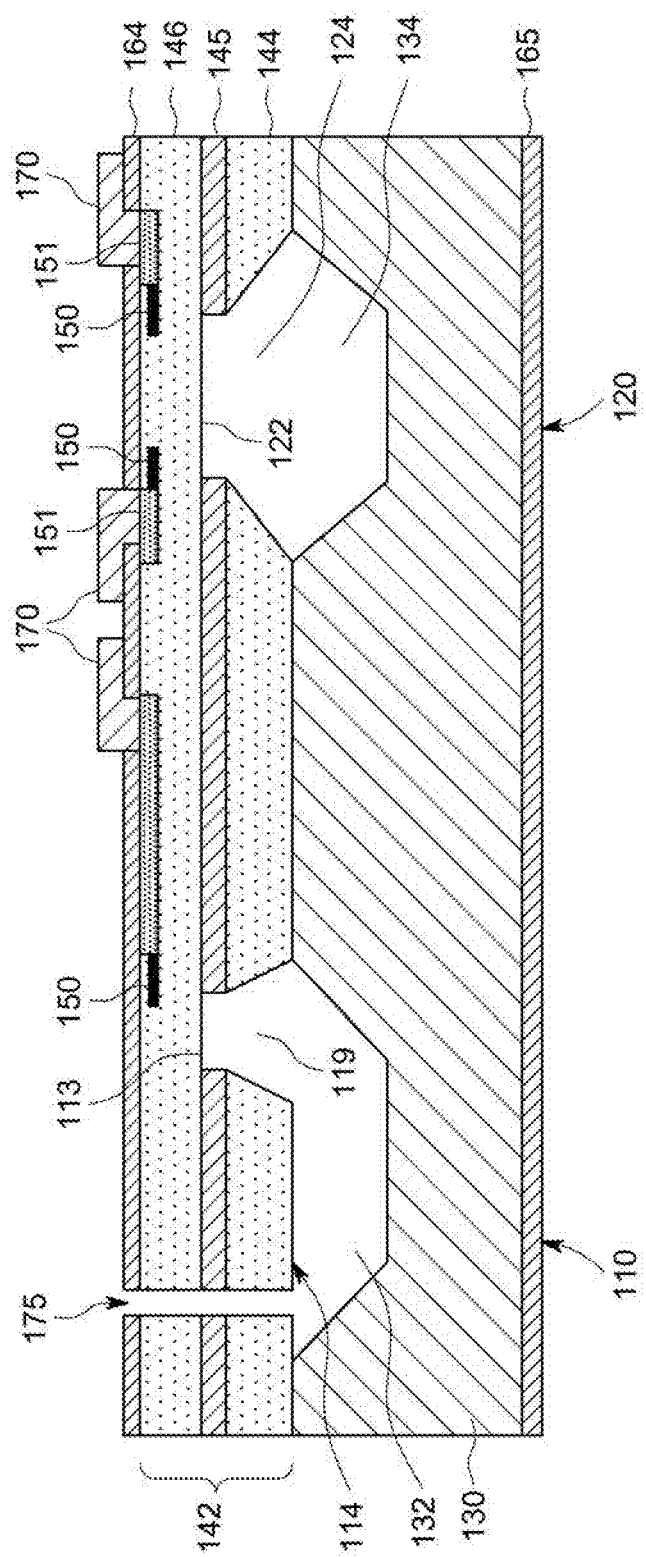
FIG. 7 is a cross sectional view of an exemplary substrate wafer with etched substrate recesses bonded to an exemplary device wafer with etched device recesses, piezoresistive sensor elements and associated interconnects, and a released proof mass in one embodiment of the invention.

Finally, the optional step of forming a suspended structure by releasing the proof mass 114 can be performed. FIG. 7 is a cross sectional view of an exemplary substrate wafer 130 with etched substrate recesses 132 and 134 bonded to an exemplary device wafer 142 with etched device recesses 119 and 122, piezoresistive sensor elements 150 and associated piezoresistive and metal interconnects, 151 and 170 respectively, and released proof mass 114 in one embodiment of the invention. Proof mass 114 can be released using conventional dry or wet etching techniques such that proof mass 114 can be suspended over substrate recess 132 by beam 113. For example, in one embodiment using exclusively dry techniques, a release etch 175 can be made through the upper chip passivation layer 164, the second device layer 146, the first oxide layer 145 and through the first device layer 144, as shown in FIG. 7. This step mechanically releases the proof mass 114 from the device wafer 142, thereby allowing beam 113 and proof mass 114 to move relative to wafer 130 and device wafer 142. For example, proof mass 114 may move up or down out of the plane of the device wafer 142 in response to an acceleration of the acceleration sensor 110. The movement of proof mass 114 causes flexure in the beam 113 that can be sensed by one or more piezoresistive sensor elements 150.

Alternatively, if different geometries for the proof mass 114 are required, different embodiments can utilize different etching techniques at different stages of the fabrication process. For example, in another embodiment, a proof mass etch (not shown), which is an additional etch of the first device layer 144, can be made while device recess 119 is being formed. The proof mass etch can be made using wet etching techniques such that upon subsequent release of the proof mass 114 the proof mass etch can form a portion of the proof mass 114 and provide it with an isotropic or anisotropic geometry. Subsequent release of the acceleration sensor 110 by dry etching of the upper chip passivation layer 164, the second device layer 146, and the first oxide layer 145 results in suspension of the proof mass 114, with isotropic or anisotropic geometry, over substrate recess 132. Alternatively, in another embodiment, the proof mass etch can be an additional dry etch of the first device layer 144 performed while device recess 119 is being formed, such that upon subsequent release of the proof mass 114 the proof mass etch can form a portion of the proof mass 114 and provide it with an anisotropic geometry. In this embodiment, subsequent dry etching of the upper chip passivation layer 164, the second device layer 146 and the first oxide layer 145 can result in suspension of the proof mass 114, with anisotropic geometry, over substrate recess 132.

Additionally, with reference again to FIG. 1, the acceleration sensor 110 can be encapsulated using a cap 117, for example, to isolate the structures from environmental effects such as humidity, or to isolate the beam 113 and proof mass 114 within a vacuum or dampening fluid or gas. Cap 117 can be bonded to device wafer 142 using a bonding material 116 through various conventional means used in the industry, for example, Au—Si, Au—Sn eutectic bonding, Au—Au thermo compression bonding, glass frit bonding, or adhesive bonding using benzocylcobutene (BCB) as the bonding material 116. Additionally, one or more dimples 118 may be included on the bottom of the recess or the underside of a cap 117 to prevent stiction when an over range displacement occurs.

Thus, a small, highly sensitive accelerometer can be produced. Thickness, and therefore massiveness, of the proof mass 114 portion of beam 113 can be determined very precisely by the thickness of the first device layer 144, first oxide layer 145 and second device layer 146. The precise thickness of the flexure portion of beam 113 can also be determined by the thickness of the second device layer 146. Together, precise control of the massiveness of proof mass 114 and the thickness of the flexure portion of beam 113 can lead to a highly selective and customizable design with more precise control over the sensitivity of the accelerometer. Thus, a smaller suspended beam structure can be produced in which flexure region thinness and seismic mass thickness can be selected to achieve desired sensitivity to changes in acceleration. Similarly, the selected thickness of the second device layer 146 leads to improved control over the flexibility of diaphragm 122. Likewise, the thickness of first oxide layer 145 can be precisely selected to control various design parameters that determine the performance of the acceleration sensor 110 and pressure sensor 120. Use of oxide layers as etch stops simplifies the fabrication process and eliminates the need for timed etches and the resulting manufacturing inconsistencies.

The methods illustrated in FIGS. 1 through 8 can be performed in parallel or in series to form integrated acceleration sensors and pressure sensors on a single chip. Performing the process in parallel offers the advantages of greater processing throughput, i.e., fewer total processing steps for the combined chip. Also, the parallel process allows for beam 113 thickness to be independent of the thickness of diaphragm 122. For instance, by etching the recesses 119 and 124 in second device layer 144 to different depths, forming beam 113 and diaphragm 122, the sensitivity of each sensor can be individually optimized.

The above detailed description is provided to illustrate exemplary embodiments and is not intended to be limiting. Although the method for fabricating a sensor has been shown and described with respect to embodiments which measure acceleration and pressure, it will be apparent to those skilled in the art that similar techniques can be used to fabricate sensors capable of measuring other parameters. It will also be apparent to those skilled in the art that numerous modifications and variations within the scope of the present invention are possible. For example, the acceleration sensor 110 and pressure sensor 120 can be manufactured on a single chip in series or in parallel with any of the exemplary methods described. The integrated sensors in a single chip can be used, for example, in a remote tire pressure and acceleration monitoring system or the like. Further, numerous other materials and processes can be used within the scope of the exemplary methods and structures described as will be recognized by those skilled in the art. For example, it should be recognized that the p-type and n-type materials described herein can be used in an alternative fashion, e.g., by replacing p-type materials for n-type materials and vice versa. Additionally, the methods described herein can be used to create an acceleration sensor 110 and pressure sensor 120 on a single chip, or used to create an independent acceleration sensor 110 or independent pressure sensor 120.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for fabricating a sensor, comprising the steps of:
    forming a substrate recess in a semiconductor substrate wafer;
    forming a device recess in a semiconductor device wafer, wherein said device wafer comprises a first device layer, a second device layer, a first oxide layer, and a second oxide layer, wherein said first oxide layer is located under said first device layer, said second device layer is located under said first oxide layer, and said second oxide layer is located under said second device layer, and wherein said device recess extends through said first device layer to expose said first oxide layer;
    securing said first device layer to said substrate wafer, wherein said device recess is aligned over said substrate recess;
    implanting a piezoresistive acceleration sensor at a first location in said second device layer and a piezoresistive pressure sensor in said second device layer at a second location, each of the sensors configured to sense flexure in said second device layer; and
    selecting a thickness of each of the first device layer, the second device layer, the first oxide layer, and the second oxide layer that corresponds to a predetermined sensitivity factor of each of the acceleration sensor and the pressure sensor.

2. The method for fabricating a sensor of claim 1, wherein said step of forming said device recess in said semiconductor device wafer further comprises the step of etching said first oxide layer using dry oxide etching techniques.

3. The method for fabricating a sensor of claim 1, wherein said step of forming said device recess in said semiconductor device wafer further comprises the step of etching said first oxide layer using wet oxide etching techniques.

4. The method for fabricating a sensor of claim 1, wherein said first oxide layer improves the high temperature performance of said sensor.

5. The method for fabricating a sensor of claim 1, wherein said first oxide layer balances internal stresses within said sensor and improves the sensitivity of said sensor.

6. The method for fabricating a sensor of claim 1, wherein the thickness of said first device layer, said first oxide layer and said second oxide layer determine the sensitivity of said sensor.

7. The method for fabricating a sensor of claim 1, further comprising the step of:
    forming a suspended structure in said device wafer disposed over said substrate recess, wherein said suspended structure includes a boundary region that is released from other portions of said device wafer except in a flexure region of the boundary region, wherein said suspended structure includes a proof mass comprised of portions of said first device layer, said first oxide layer and said second device layer, wherein said flexure region of said boundary region and released portion of said boundary region are disposed to permit movement of said proof mass in response to a force, wherein said movement of said proof mass causes flexure in said flexure region, and wherein at least one of said piezoresistive acceleration sensor and said piezoresistive pressure sensor senses said flexure in said flexure region.

8. The method for fabricating a sensor of claim 7, wherein in said step of forming said suspended structure in said device wafer disposed over said substrate recess said boundary region is released from said other portions of said device wafer using dry semiconductor and oxide etching techniques.

9. The method for fabricating a sensor of claim 7, wherein said step of forming said device recess in said semiconductor-device wafer further comprises the step of forming a proof mass recess in said device wafer, wherein said proof mass recess extends through said first device layer to expose said first oxide layer, wherein in said step of forming said suspended structure in said device wafer disposed over said substrate recess said boundary region is released from said other portions of said device water using dry semiconductor and oxide etching techniques, and wherein a portion of said proof mass recess forms a portion of said proof mass.

10. The method for fabricating a sensor of claim 9, wherein said step of forming said proof mass recess in said device wafer uses dry semiconductor etching techniques.

11. The method for fabricating a sensor of claim 9, wherein said step of forming said proof mass recess in said device wafer uses wet semiconductor etching techniques.

12. The method for fabricating a sensor of claim 7, wherein in said step of securing said first device layer of said device wafer to said surface of said substrate wafer said device recess is aligned entirely over said substrate recess.

13. The method for fabricating a sensor of claim 1, wherein said second device layer forms a diaphragm over said device recess and said substrate recess that allows flexure in said second device layer, and wherein at least one of said piezoresistive acceleration sensor and said piezoresistive pressure sensor senses said flexure in said diaphragm.

14. The method for fabricating a sensor of claim 13, wherein in said step of securing said first device layer of said device wafer to said surface of said substrate wafer said device recess is centered over said substrate recess.

15. The method for fabricating a sensor of claim 13, wherein said piezoresistive pressure sensor measures pressure.

16. The method for fabricating a sensor of claim 1, wherein said step of forming a substrate recess in said semiconductor substrate wafer is performed using dry semiconductor etching techniques.

17. The method for fabricating a sensor of claim 1, wherein said step of forming a substrate recess in said semiconductor substrate wafer is performed using wet semiconductor etching techniques.

18. The method for fabricating a sensor of claim 1, wherein said step of forming said device recess in said semiconductor device wafer is performed using dry semiconductor etching techniques.

19. The method for fabricating a sensor of claim 1, wherein said step of forming said device recess in said semiconductor device wafer is performed using wet semiconductor etching techniques.

* * * * *

UNITED STATES PATENT AND TRADEMARK OFFICE
CERTIFICATE OF CORRECTION

PATENT NO. : 8,569,092 B2  Page 1 of 1
APPLICATION NO. : 12/647660
DATED : October 29, 2013
INVENTOR(S) : Mantravadi et al.

It is certified that error appears in the above-identified patent and that said Letters Patent is hereby corrected as shown below:

In the Claims:

In Column 12, Line 38, in Claim 9, delete "water" and insert -- wafer --, therefor.

Signed and Sealed this
Seventh Day of January, 2014

Margaret A. Focarino
*Commissioner for Patents of the United States Patent and Trademark Office*